(12) United States Patent
Boettiger (10) Patent No.: US 7,965,444 B2
(45) Date of Patent: Jun. 21, 2011

(54) METHOD AND APPARATUS TO IMPROVE FILTER CHARACTERISTICS OF OPTICAL FILTERS

(75) Inventor: Ulrich C. Boettiger, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 172 days.

(21) Appl. No.: 11/513,264

(22) Filed: Aug. 31, 2006

(65) Prior Publication Data

US 2008/0121781 A1 May 29, 2008

(51) Int. Cl.
*H01L 31/0232* (2006.01)
(52) U.S. Cl. ........ 359/575; 359/558; 359/566; 359/569; 257/294; 257/E21.13; 438/48; 438/57; 438/69
(58) Field of Classification Search .................... 359/40, 359/68, 95, 743, 569, 570, 680, 689, 733, 359/566, 576, 692, 127, 130, 161, 558; 349/57, 349/108, 201; 357/23, 30, 24, 55, 304, 311, 357/31; 348/340; 372/20, 32, 36; 350/96.14, 350/96.11, 96.12; 385/37, 122, 10, 31, 40, 385/130; 257/294, E27.13; 438/48, 57, 69
See application file for complete search history.

(56) References Cited

U.S. PATENT DOCUMENTS

| | | | | |
|---|---|---|---|---|
| 4,173,765 A * | 11/1979 | Heald et al. | | 257/291 |
| 4,708,436 A * | 11/1987 | Kleinknecht | | 359/575 |
| 4,993,032 A * | 2/1991 | Bradley | | 372/20 |
| 5,076,687 A * | 12/1991 | Adelson | | 356/4.04 |
| 5,701,005 A | 12/1997 | Meyers | | |
| 5,742,373 A * | 4/1998 | Alvelda | | 349/201 |
| 6,140,630 A | 10/2000 | Rhodes | | |
| 6,174,648 B1 * | 1/2001 | Terao et al. | | 430/321 |
| 6,177,333 B1 | 1/2001 | Rhodes | | |
| 6,204,524 B1 | 3/2001 | Rhodes | | |
| 6,310,366 B1 | 10/2001 | Rhodes et al. | | |
| 6,326,652 B1 | 12/2001 | Rhodes | | |
| 6,333,205 B1 | 12/2001 | Rhodes | | |
| 6,358,793 B1 | 3/2002 | Yates et al. | | |

(Continued)

FOREIGN PATENT DOCUMENTS

EP 1 840 968 10/2007

(Continued)

OTHER PUBLICATIONS

Nixon et al., "256×256 CMOS Active Pixel Sensor Camera-on-a-Chip," IEEE Journal of Solid State Circuits, vol. 31 (12), pp. 2046-2050 (1996).

(Continued)

*Primary Examiner* — Leonaro Andújar
*Assistant Examiner* — William Harriston
(74) *Attorney, Agent, or Firm* — Dickstein Shapiro LLP (57) ABSTRACT

An optical filter structure for an imager which has customized sub-wavelength elements used to maintain the filter characteristics accordingly across a photo-conversion device to optimize the structure for the angle of incidence as it changes across the imager photo-conversion device. In particular, the layout (e.g., grating period among other parameters) of the sub-wavelength elements used in the structure design are customized to change with the angle of incidence of the optics used to project the image. The sub-wavelength elements are typically built by high resolution lithographic processes such as optical or imprint lithography.

33 Claims, 6 Drawing Sheets

U.S. PATENT DOCUMENTS

| | | | | |
|---|---|---|---|---|
| 6,362,513 | B2 * | 3/2002 | Wester | 257/432 |
| 6,487,015 | B2 * | 11/2002 | Kitamura et al. | 359/558 |
| 6,586,811 | B2 * | 7/2003 | Sekine | 257/432 |
| 6,643,429 | B2 * | 11/2003 | Robinson et al. | 385/37 |
| 6,704,149 | B2 * | 3/2004 | Ohmori et al. | 359/743 |
| 6,738,171 | B1 | 5/2004 | Campbell | |
| 6,783,900 | B2 | 8/2004 | Venkataraman | |
| 6,819,833 | B1 * | 11/2004 | Malo | 385/37 |
| 6,823,091 | B2 | 11/2004 | Slavin | |
| 6,927,915 | B2 * | 8/2005 | Nakai | 359/569 |
| 6,993,207 | B1 | 1/2006 | Slavin | |
| 7,005,627 | B2 * | 2/2006 | Lim | 250/208.1 |
| 7,015,529 | B2 | 3/2006 | Yates et al. | |
| 7,038,184 | B2 * | 5/2006 | Chang | 250/208.1 |
| 7,068,432 | B2 | 6/2006 | Boettiger et al. | |
| 7,110,598 | B2 | 9/2006 | Hu | |
| 7,154,546 | B1 | 12/2006 | Cho | |
| 7,250,591 | B2 * | 7/2007 | Mouli | 250/208.1 |
| 7,439,479 | B2 * | 10/2008 | Mouli | 250/208.1 |
| 7,476,833 | B2 * | 1/2009 | Inaba | 250/208.1 |
| 7,560,681 | B2 * | 7/2009 | Moon et al. | 250/208.1 |
| 2002/0024086 | A1 | 2/2002 | Yates et al. | |
| 2003/0016879 | A1 | 1/2003 | Slavin | |
| 2003/0021475 | A1 | 1/2003 | Slavin | |
| 2003/0086155 | A1 * | 5/2003 | Ovadia et al. | 359/344 |
| 2003/0205749 | A1 | 11/2003 | Yates et al. | |
| 2004/0081398 | A1 * | 4/2004 | Jette et al. | 385/37 |
| 2005/0024520 | A1 * | 2/2005 | Yamamoto | 348/340 |
| 2005/0025422 | A1 * | 2/2005 | Magnusson et al. | 385/37 |
| 2005/0218328 | A1 * | 10/2005 | Suzuki et al. | 250/353 |
| 2006/0006448 | A1 | 1/2006 | Yates et al. | |
| 2006/0102827 | A1 * | 5/2006 | Kasuga et al. | 250/208.1 |
| 2006/0140505 | A1 | 6/2006 | Slavin | |
| 2006/0140506 | A1 | 6/2006 | Slavin | |
| 2006/0147127 | A1 | 7/2006 | Slavin | |
| 2006/0186319 | A1 * | 8/2006 | Mouli | 250/208.1 |
| 2006/0255372 | A1 | 11/2006 | Patrick et al. | |
| 2006/0268143 | A1 | 11/2006 | Boettiger et al. | |
| 2006/0289956 | A1 * | 12/2006 | Boettiger et al. | 257/432 |
| 2007/0001094 | A1 * | 1/2007 | Rhodes | 250/208.1 |
| 2007/0069108 | A1 * | 3/2007 | Inaba | 250/208.1 |
| 2007/0070507 | A1 * | 3/2007 | Yee et al. | 359/622 |
| 2007/0153358 | A1 * | 7/2007 | Duston et al. | 359/275 |
| 2007/0217742 | A1 * | 9/2007 | Reid et al. | 385/37 |
| 2007/0298533 | A1 * | 12/2007 | Yang et al. | 438/57 |
| 2008/0056707 | A1 * | 3/2008 | Ovsiannikov et al. | 396/375 |
| 2008/0094716 | A1 * | 4/2008 | Ushiro et al. | 359/620 |
| 2008/0271784 | A1 * | 11/2008 | Duston et al. | 136/259 |

FOREIGN PATENT DOCUMENTS

WO    WO 2005/008781    1/2005

OTHER PUBLICATIONS

Mendis et al., "CMOS Active Pixel Image Sensors," IEEE Transaction on Electron Devices, vol. 41 (3), pp. 452-453 (1994).

Kostal et al., "MEMS Meets Nano-Optics," Fiber Optic Technology, Nov. 2005, pp. 8-13.

NanoOpto Introduces New Nano-optic Bandpass Filter Designed for High Volume, High Performance Digital Imaging Applications, Press Release, NanoOpto Corporation, Jan. 31, 2005.

* cited by examiner

METHOD AND APPARATUS TO IMPROVE FILTER CHARACTERISTICS OF OPTICAL FILTERS

FIELD OF THE INVENTION

Embodiments of the invention relate generally to solid state imaging devices and more particularly to a method and apparatus that optically improve filter characteristics in a solid state image sensor.

BACKGROUND OF THE INVENTION

Imaging devices, including charge coupled devices (CCD) and complementary metal oxide semiconductor (CMOS) sensors, and others, have commonly been used in photo-imaging applications. A CMOS imager circuit includes a focal plane array of pixel cells, each one of the cells including a photosensor, for example, a photogate, photoconductor or a photodiode for accumulating photo-generated charge in the specified portion of the substrate. Each pixel cell has a charge storage region, formed on or in the substrate, which is connected to the gate of an output transistor that is part of a readout circuit. The charge storage region may be constructed as a floating diffusion region. In some imager circuits, each pixel may include at least one electronic device such as a transistor for transferring charge from the photosensor to the storage region and one device, also typically a transistor, for resetting the storage region to a predetermined charge level prior to charge transference.

In a CMOS imager, the active elements of a pixel cell perform the functions of: (1) photon to charge conversion; (2) accumulation of image charge; (3) resetting the storage region to a known state; (4) transfer of charge to the storage region; (5) selection of a pixel for readout; and (6) output and amplification of signals representing pixel reset level and pixel charge. Photo charge may be amplified when it moves from the initial charge accumulation region to the storage region. The charge at the storage region is typically converted to a pixel output voltage by a source follower output transistor.

CMOS image sensors of the type discussed above are generally known as discussed, for example, in Nixon et al., "256×256 CMOS Active Pixel Sensor Camera-on-a-Chip," IEEE Journal of Solid-State Circuits, Vol. 31(12), pp. 2046-2050 (1996); and Mendis et al., "CMOS Active Pixel Image Sensors," IEEE Transactions on Electron Devices, Vol. 41(3), pp. 452-453 (1994). See also U.S. Pat. Nos. 6,140,630, 6,177,333, 6,204,524, 6,310,366, 6,326,652, and 6,333,205, assigned to Micron Technology, Inc., the contents of which are incorporated herein by reference.

CMOS, CCD and other solid state imagers may use an optical filter to transmit image light to a solid state sensor having an array of pixels. Optical filters employing grating elements can be used as a global light wavelength filter over the top of an imager to filter light across an entire array, for example, as an infra-red (IR) light block. In addition, optical filters having grating elements are now being fabricated as nano-structure-based optics or nano-optics, which are a class of optical devices that allow optical devices to be realized that are thin, offer high performance and are highly reliable. See Kostal et al., *MEMS Meets Nano-Optics*, FIBER OPTIC TECHNOLOGY, November 2005, pp. 8-13; see also *NanoOpto Introduces New Nano-optic Bandpass Filter Designed for High Volume, High Performance Digital Imaging Applications*, Press Release, NanoOpto Corporation, Jan. 31, 2005.

One drawback with an optical filter is that as the angle of incidence of incoming light gets sharper, i.e., begins angling away from the light path which is normal to the grating, the filter fails to block undesired wavelengths and/or fails to allow the desired light wavelengths to pass through. As a result, the optical filter is less efficient in its filtering characteristics, which can result in image color shading and artifact formation.

Accordingly, there is a need and desire for an apparatus and method for improving an optical filter employing grating elements for use in imaging devices.

DETAILED DESCRIPTION OF THE INVENTION

In the following detailed description, reference is made to the accompanying drawings, which form a part hereof and illustrate specific embodiments in which they may be practiced. In the drawings, like reference numerals describe substantially similar components throughout the several views. These embodiments are described in sufficient detail to enable those skilled in the art to practice the embodiments, and it is to be understood that other embodiments may be utilized, and that structural, logical and electrical changes may be made without departing from them.

Figure 1:
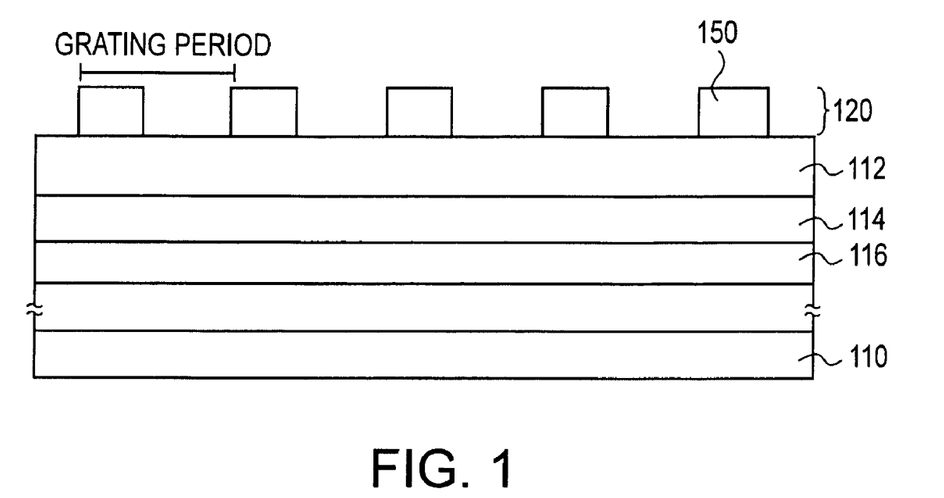
FIG. 1 is an illustration of a typical optical filter.

FIG. 1 illustrates a typical optical filter 120 employing grating elements 150. A complete filter will also include integrating fill material 180 and index matching, or anti-reflection, coatings 190 on either side of the elements of grating structure 150, as shown in FIG. 2.

Figure 2:
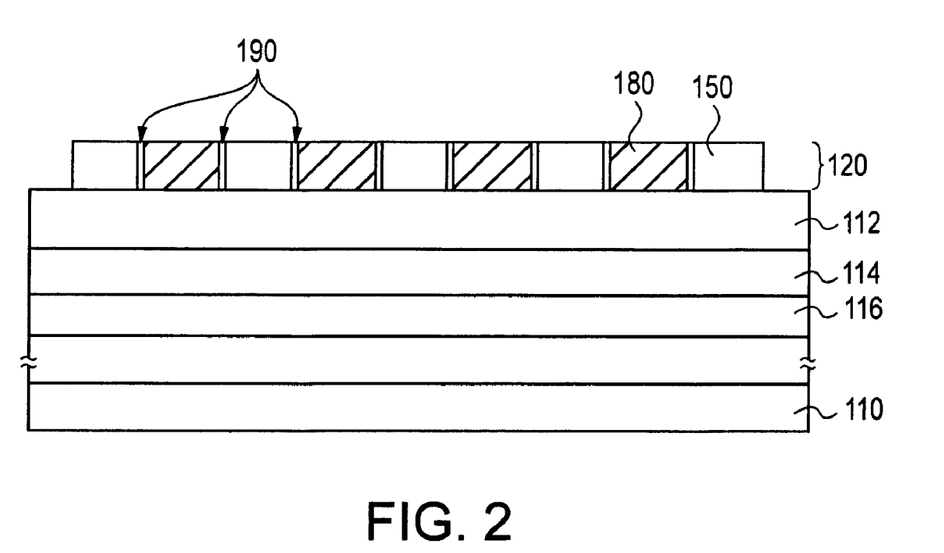
FIG. 2 is another illustration of a typical optical filter.

Referring to FIGS. 1 and 2, a typical optical filter used as a global filter 120 for a solid state image sensor 110 comprises grating elements 150 that are constructed above an image sensor 110, which may represent an entire sensor array in the case of a global filter. It should be appreciated that an actual image sensor will comprise several fabricated layers between a photosensor level and an upper micro-lens level. For example, film layers 112, 114 and 116 can be formed. A global filter 120 may be provided above the micro-lens level. In a typical optical filter, the distance between the outside edges of the grating elements 150 that filter the incoming light, i.e., the grating period, is equal across the entire filter above the image sensor 110. For example, for devices designed as a global filter for operation in the near IR range, with undesired wavelengths from roughly 600 nm to 3 μm, the distance between the outside edge of one structural grating element to the outside edge of the next structural grating element (i.e., the grating period) is on the order of several hundred nanometers or less. In other words, the grating period between the grating elements is sufficiently less than the wavelength of the light that the optical filter intends to block that these wavelengths of light are reflected and prevented from passing through the filter.

However, in the typical optical filter employed as global filter 120, the characteristics of the light being passed are affected by the angle of incidence of the light entering the filter. For example, as the angle of incidence gets sharper, i.e., begins angling away from a path which is normal to the filter 120 and image sensor 110, the global filter 120 fails to block undesired wavelengths of light and thus, allows light at these wavelengths to pass through, causing the characteristics of the light reaching the photosensors in image sensor 110 to be different than expected. Due to the angle of incidence, the grating period becomes skewed, making the grating elements of the global filter no longer entirely effective in blocking undesired light from reaching image sensor 110.

Figure 3:
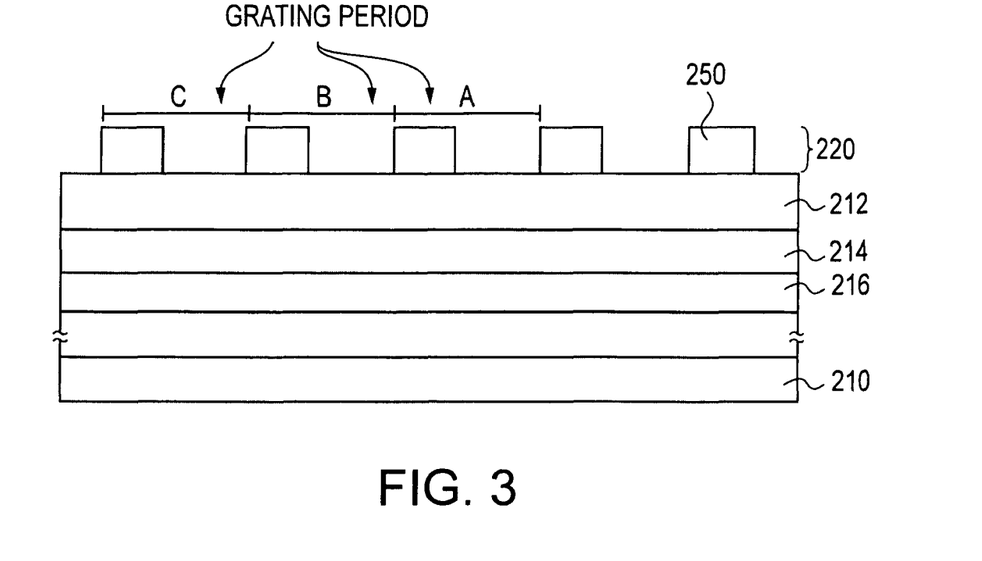
FIG. 3 is an illustration of an optical filter in accordance with an embodiment described herein.
Figure 4:
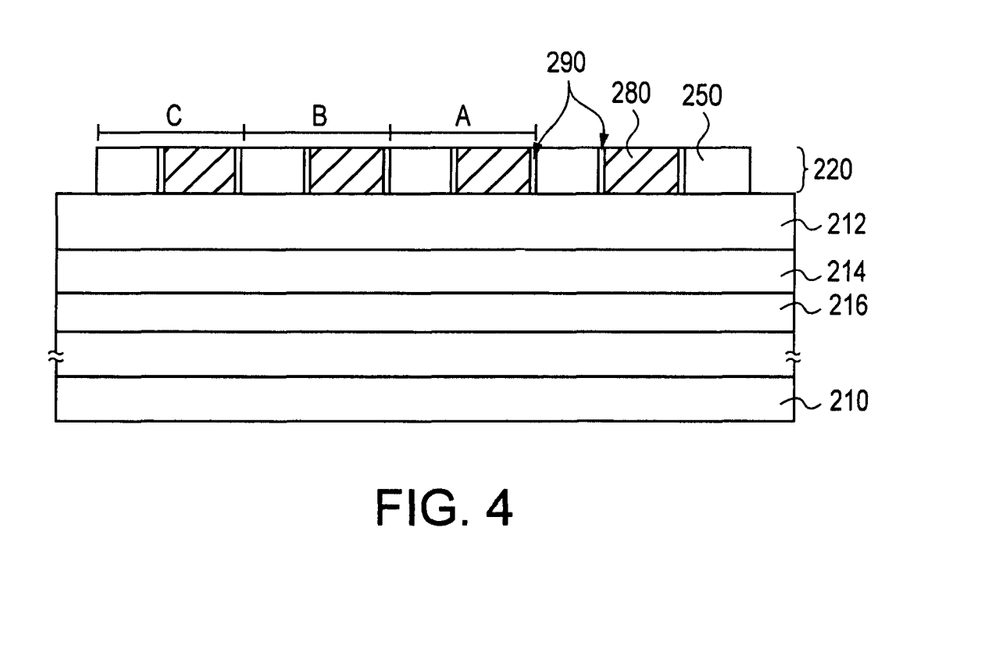
FIG. 4 is another illustration of an optical filter in accordance with an embodiment described herein.

FIGS. 3 and 4 show embodiments of the invention which address this problem. The embodiments provide a method and apparatus of inversely changing the affected light characteristics by altering the uniform grating period between grating elements of the optical filter. The typical optical filter, shown in FIGS. 1 and 2, will change its transmitted wavelength spectrum as the incident angle changes, while optical filter 220 having a variable (non-uniform) grating period, as shown in FIGS. 3 and 4, will have less of such a change. Optical filter 220 will improve the properties of a combined layer stack and grating structure as shown in FIGS. 1 and 2. It should be appreciated that the embodiments, for example, can be implemented and applied in the construction of any type of global color filter, that is, a filter designed to be a light block and/or a pass band filter across an entire array.

In one embodiment of the invention, the grating period of the optical filter 220 non-uniformly changes, i.e., increases, across the surface of the optical filter 220 and thus over an image sensor 210 containing an array of pixels. The grating elements are formed at non-uniform grating periods across the optical filter and as a result, the angular shift in transmitted light can be partly compensated for. The grating period of the optical filter 220 is based on the wavelength of light desired to be passed through the optical filter 220. The grating period corresponds to the distance from the outside edge of one grating element to the outside edge of the next grating element along the surface of the optical filter 220. It should be appreciated that other grating parameters can be modified as well to influence the transmission wavelengths such as the grating material and the shape, thickness and duty cycle of the grating structures.

Similar to FIGS. 1 and 2, between optical filter 220 and image sensor 210, film layers 212, 214 and 216 can be formed. These additional film layers 212, 214, 216 further define and/or filter the reflected or transmitted wavelengths of the optical filter. Although FIGS. 3 and 4 illustrate one optical filter and a specific number of film layers, the specific number of film layers and optical filters can be varied, and their arrangement (e.g., two gratings sandwiching film layers, a grating buried in a film stack, etc.) can be adjusted to meet design objectives.

The grating period of optical filter 220 is a certain distance A in the center of the optical filter 220 corresponding to a first desired wavelength to be passed through the optical filter 220. Then, the grating period increases progressively as the grating period approaches the edge of the optical filter. In other words, the grating period will become greater, i.e., the distance between the outside edges of the elements will become farther, as the grating elements 250 reach an edge of the optical filter 220. For example, the resulting grating elements 250 of the optical filter 220 along the outer-most grating elements, on the edges, will have a greater spaced grating period, for example grating period C. The grating elements 250 will progress to the desired wavelength grating period at the center-most grating elements, for example grating period A. In between the outer-most grating period C and the inner-most grating period A, the grating periods, e.g., grating period B, will be less than C, but greater than A. It should be appreciated that although the grating period is described in relation to three grating periods A, B, C, the embodiments should not be limited to only three possible grating periods, but that the grating periods are an unlimited gradual progression from the outer-most grating periods to the inner-most grating periods, e.g., grating periods C to A.

Widening the outside grating periods of the optical filter compensates for the change in light characteristics exhibited by the angling of incident light. Thus, the embodiments allow a global filter, e.g., IR block, to have a reduced amount of the undesired change of cutoff wavelength of the transmitted light, e.g., IR light, passing through the optical filter 220 and reaching the respective image sensor 210. The resonant wavelength of an optical filter is predominantly determined by the grating period.

Similar to the typical optical filter, the optical filter of the embodiments include integrating fill material 280 and index matching, or anti-reflection, coatings 290 on either side of the grating element 250. It should be appreciated that the materials used in constructing the optical filter grating elements can include silicon nitride (SiNx), silicon dioxide (SiO$_2$), aluminum (Al), gold (Au) and metals such as silver (Ag) can be used in various combinations. The same materials can likewise be used to form the coatings on either side of the grating elements. It should also be appreciated that the use of several material and structure combinations can yield the same optical function, while allowing optical filters to be readily designed with reliability, and environmental and usage objectives in mind. Therefore, the mentioned list and their resulting combinations should not be considered an exhaustive list.

The general design steps required to create a single layer optical filter include forming the filter having grating elements formed at non-uniform grating periods across the filter with the grating period becoming wider the farther they are from the center of the filter. The grating period may change continuously from the center of the filter to the edge of the filter, or may change in stepped increments. Materials can be selected which have minimal absorption in the wavelength range of interest and selecting a substrate that is optically transparent and has a coefficient of thermal expansion that effectively matches that of the optical filter 220 across the range of operating and storage temperatures. For example, when IR light is the desired light to be blocked by a global filter constructed in accordance with optical filter 220, the filter is formed of aluminum with grating elements having a grating period of approximately 650 nm at the center of the filter and approximately 720 nm at the edge of the filter.

In an embodiment of the invention, the change in grating periods can be calculated as follows:

$$g = g(0)/\cos(\text{alpha})$$

where g is the local grating constant (g changes across the filter as a function of the angle of incident light), g(o) is a grating constant at the vertical incidence of light (i.e., center of the filter), and alpha is the angle of incidence of the light wavelength (where 0 degrees=vertical). The result will be an increased separation between grating lines (the outside edges of the grating elements) gradually across the filter while keeping the center-most grating period constant. Due to the symmetry requirements on an imager, a circular shape for the grating lines is the preferred embodiment, where the grating period between the circles gradually increase as described above. Circles exceeding the outer-most grating elements could be cut-off resulting in a rectangular grating pattern that matches the image sensor size. It should be appreciated that the optical filter 220 should be aligned with the image sensor 210 so that the optical center of the image sensor 210 lines up with the center of the optical filter 220.

Figure 5:
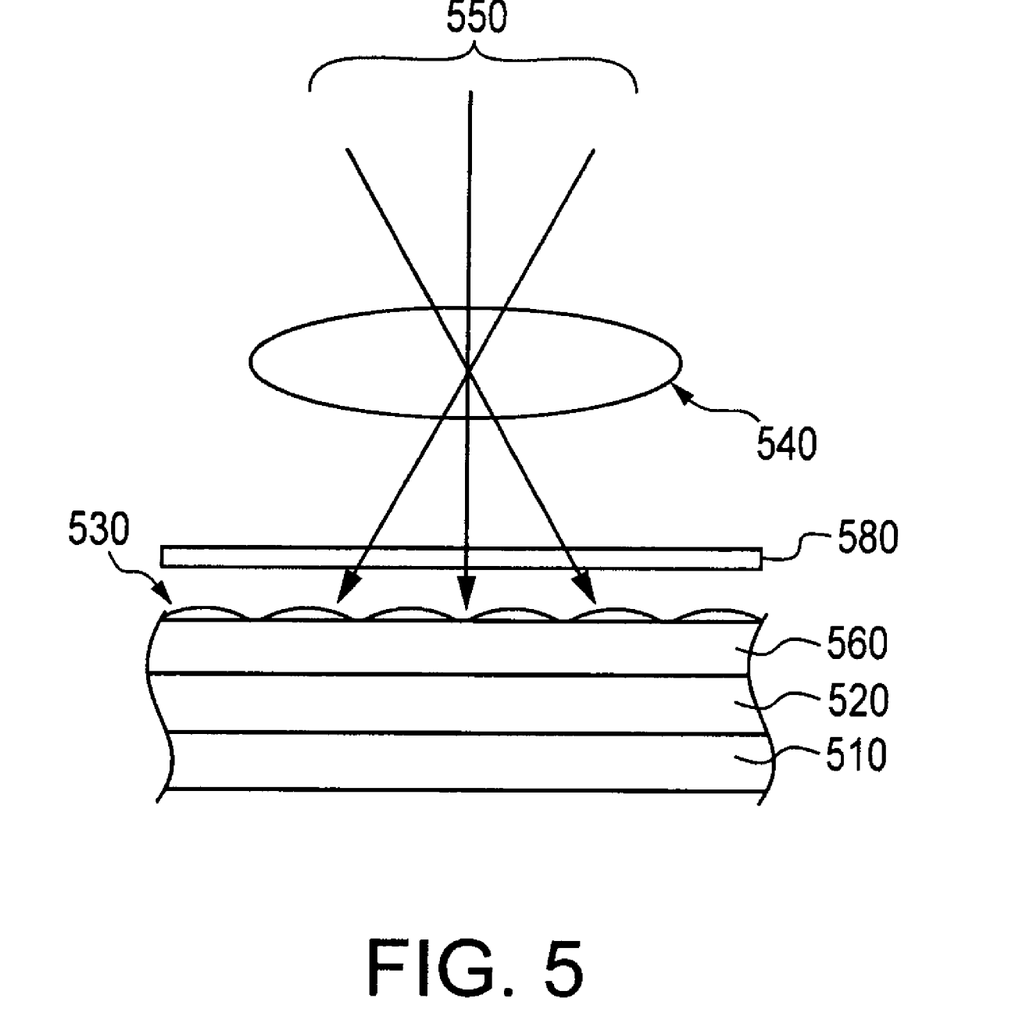
FIG. 5 shows a cross sectional view of an imager module constructed in accordance with an embodiment described herein.
Figure 6:
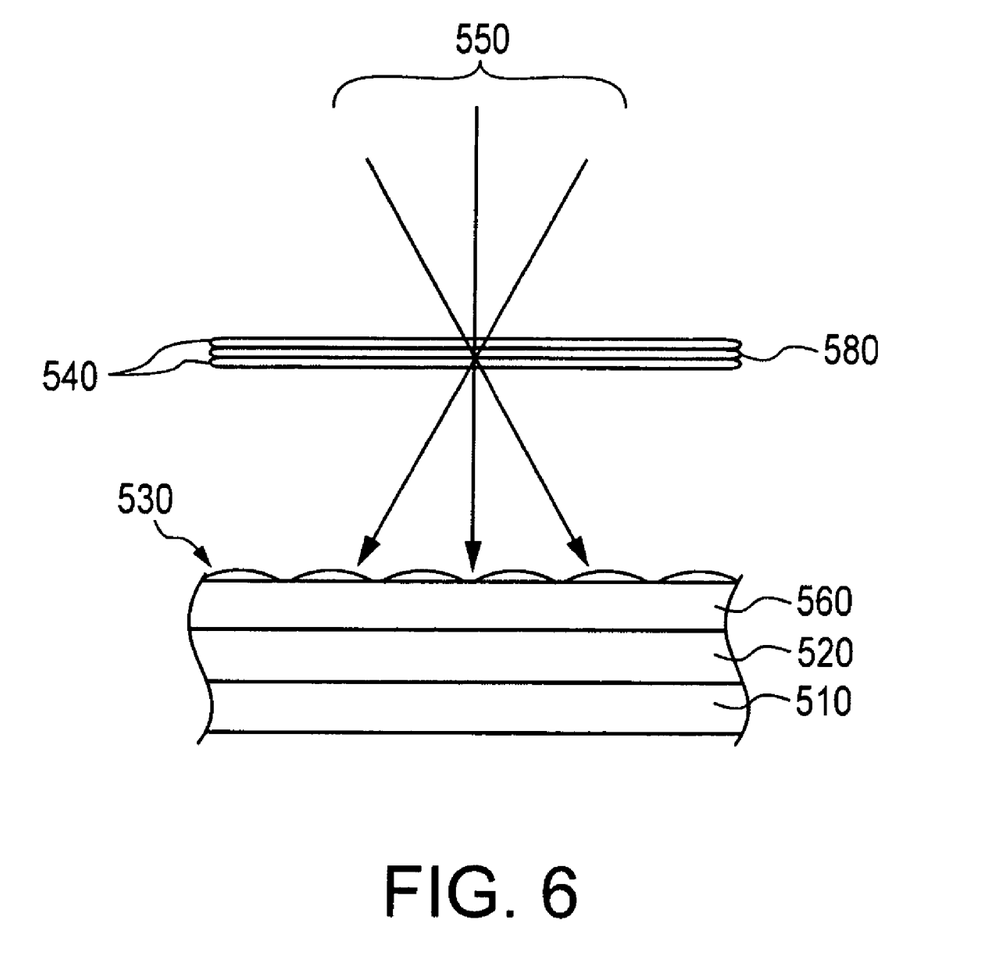
FIG. 6 is an illustration of an optical filter in accordance with another embodiment described herein.

FIG. 5 shows a cross-sectional view of an imager module constructed in accordance with an embodiment of the invention. The imager module comprises a pixel array implemented in a substrate (e.g., a silicon substrate) 510 and a layer of protective silicon oxide 520, which may be also serve as a support for metal interconnects. The imager module also includes a color filter array 560 (e.g., a Bayer CFA) to allow only light of a specific wavelength to pass to each pixel within the active pixel array of substrate 510, a layer of micro-lenses 530 that concentrate the incident light to the sensitive area of the underlying pixel, and a main lens 540 that focuses a light ray 550 from the object onto the micro-lenses 530. The imager module further includes an optical filter 580 above the micro-lenses 530. The optical filter 580 is formed between lens 540 and micro-lenses 530. It should also be appreciated that the optical filter 580 can be implemented as part of the main lens system. For example, the optical filter 580 can be integrated into lens 540, e.g., a lens wafer or a lens with the optical filter on the surface of the lens with a molded lens on top of the filter, as shown in FIG. 6.

The embodiments described herein provide an improved optical filter that reduces the change of cutoff wavelength of the optical filter with the angle of light incidence. Additionally, embodiments described herein exhibit a number of advantages including eliminating the shift of the transition wavelength of the filter with incident angle of light; reducing or eliminating the formation of unwanted transmission peaks at wavelengths intended to be blocked; and reducing or eliminating the change in transmission at wavelengths intended to pass through the filter.

Figure 7:
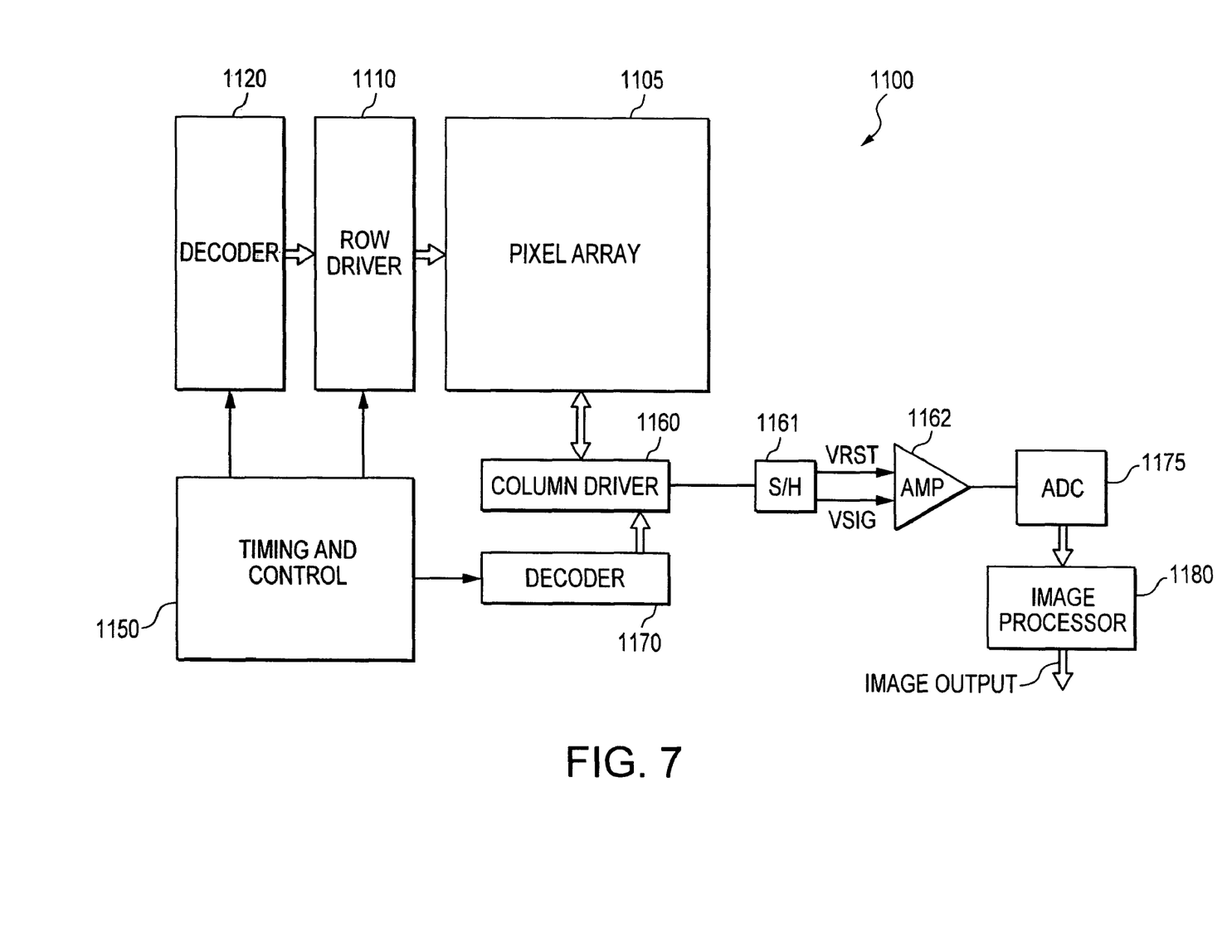
FIG. 7 shows a CMOS image sensor that can be implemented in conjunction with the optical filter constructed in accordance with an embodiment described herein.

FIG. 7 illustrates an imager 1100 that may utilize any embodiment described above. The imager 1100 has a pixel array 1105 having pixels working in conjunction with the optical filter (i.e., FIG. 3) constructed in accordance with an embodiment. Row lines are selectively activated by a row driver 1110 in response to row address decoder 1120. A column driver 1160 and column address decoder 1170 are also included in the imager 1100. The imager 1100 is operated by the timing and control circuit 1150, which controls the address decoders 1120, 1170.

A sample and hold circuit 1161 associated with the column driver 1160 reads a pixel reset signal Vrst and a pixel image signal Vsig for selected pixels. A differential signal (Vrst–Vsig) is amplified by differential amplifier 1162 for each pixel and is digitized by analog-to-digital converter 1175 (ADC). The analog-to-digital converter 1175 supplies the digitized pixel signals to an image processor 1180, which forms a digital image.

Figure 8:
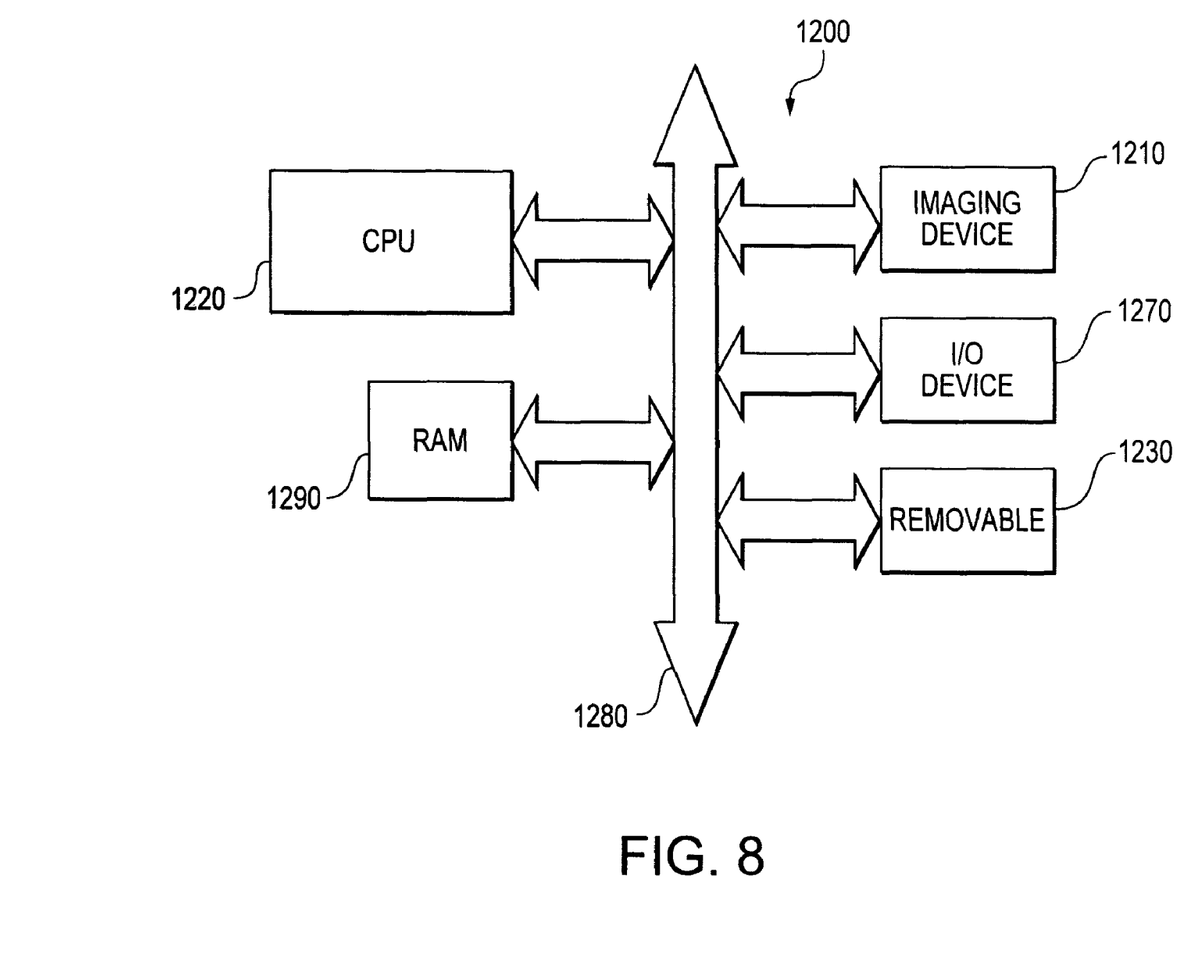
FIG. 8 shows a processor system incorporating at least one imager and an optical filter constructed in accordance with an embodiment described herein.

FIG. 8 shows a system 1200, a typical processor system modified to include an imaging device 1210 (such as the imaging device 1100 illustrated in FIG. 7) and an optical filter (i.e., FIG. 3) of an embodiment described above. The processor system 1200 is an example of a system having digital circuits that could include image sensor devices. Without being limiting, such a system could include a computer system, digital camera system, scanner, machine vision, vehicle navigation, video phone, surveillance system, auto focus system, star tracker system, motion detection system, image stabilization system, and other systems employing an imager.

System 1200, for example a digital camera system, generally comprises a central processing unit (CPU) 1220, such as a microprocessor, that communicates with an input/output (I/O) device 1270 over a bus 1280. Imaging device 1210 also communicates with the CPU 1220 over the bus 1280. The processor-based system 1200 also includes random access memory (RAM) 1290, and can include removable memory 1230, such as flash memory, which also communicate with the CPU 1220 over the bus 1280. The imaging device 1210 may be combined with a processor, such as a CPU, digital signal processor, or microprocessor, with or without memory storage on a single integrated circuit or on a different chip than the processor.

It should be appreciated that there are likely many alternatives for materials that may be suitably employed to provide the optical filter for integrated image sensors including metals, polymers, semiconductors, and dielectrics. If the requirements of the optical filter cannot be met with a single material than a combination of materials can be used. It should also be appreciated that there are several varying grating parameters that can be derived such as e.g., increasing the period of the grating to increase the resonant wavelength; increasing the duty cycle will result in a change in the resonant wavelength and/or a variation in the full width at half maximum; changing the incidence angle to change the resonant wavelength; and varying the index of the grating structure or of the filter to change the resonant wavelength.

The processes and devices described above illustrate preferred methods and typical devices of many that could be used and produced. The above description and drawings illustrate embodiments, which achieve the described objects, features, and advantages. However, it is not intended that the embodiments be strictly limited to the above-described and illustrated embodiments. Any modification, though presently unforeseeable, of the embodiments that comes within the following claims should be considered part of the invention.

What is claimed as new and desired to be protected by Letters Patent of the United States is:

1. An imager comprising:
   a pixel array formed over a substrate, said pixel array including a plurality of pixels arranged in a pattern; and
   a global filter having one set of opaque and non-uniformly spaced grating elements formed over said entire pixel array and said plurality of pixels, the one set of grating elements being spaced apart so that incident light can pass between them to reach said pixel array at a first spacing at a center of the filter and a second wider spacing at an edge of the filter.

2. The imager of claim 1, wherein said filter is a part of a lens which provides said image to said pixel array.

3. The imager of claim 1, further comprising at least a third spacing of said non-uniformly spaced grating elements which is in between said first spacing and said second wider spacing and located between said center of said filter and said edge of said filter.

4. The imager of claim 3, wherein the spacing of said grating elements changes continuously from the center of said filter to the edge of said filter.

5. The imager of claim 3, wherein the spacing of said grating elements changes in stepped increments from the center of said filter to the edge of said filter.

6. The imager of claim 1, wherein said filter is an infra-red block filter.

7. The imager of claim 1, wherein said pixel array has an associated micro-lens array and said filter is formed over said micro-lens array.

8. An imager comprising:
a pixel array formed over a substrate, the pixel array including a plurality of pixels;
a lens for providing an image to said pixel array; and
a global optical filter formed across said entire pixel array and each of said plurality of pixels, said filter having an arrangement of a plurality of opaque grating elements with a spacing between grating elements so that incident light can pass between them to reach said pixel array, the spacing changing from a center to an edge of said filter, wherein the spacing between grating elements at the edge of the filter is wider than the spacing between grating elements at the center of the filter.

9. The imager of claim 8, wherein the spacing of said plurality of grating elements changes continuously from the center of said filter to the edge of said filter.

10. The imager of claim 8, wherein the spacing of said plurality of grating elements changes in stepped increments from the center of said filter to the edge of said filter.

11. The imager of claim 8, wherein said plurality of grating elements comprise silicon dioxide.

12. The imager of claim 8, wherein said plurality of grating elements comprise a nitride.

13. A system comprising:
a processor coupled to an imager, said imager comprising:
a pixel array having individual pixels arranged in a pattern formed over a substrate; and
a global filter having an arrangement of opaque and non-uniformly spaced grating elements formed over said entire pixel array, the grating elements being spaced apart so that incident light can pass between them to reach said pixel array at a first spacing at a center of the filter and a second wider spacing at an edge of the filter.

14. The system of claim 13, wherein said filter is part of a main lens.

15. The system of claim 13, wherein said pixel array has an associated micro-lens array and said filter is formed over said micro-lens array.

16. The system of claim 13, wherein the spacing of said grating elements changes continuously from the center of said filter to the edge of said filter.

17. The system of claim 13, wherein the spacing of said grating elements changes in stepped increments from the center of said filter to the edge of said filter.

18. The system of claim 13, wherein said grating elements comprise silicon dioxide.

19. A method of forming an imager, the method comprising the step of:
forming an imaging device comprising a plurality of pixels arranged in a pattern; and
forming a single filter over said plurality of pixels of the imaging device, the filter having opaque and non-uniformly spaced grating elements spaced apart so that incident light can pass between them to reach the imaging device, wherein a first narrower spacing of grating elements occurs at a center of the filter and a second wider spacing of grating elements occurs at an edge of the filter.

20. The method of claim 19, wherein said forming the filter step further comprises forming at least a third spacing of said grating elements in between said first narrower spacing and said second wider spacing located between said center of said filter and said edge of said filter.

21. The method of claim 20, wherein the spacing of the formed grating elements changes continuously from the center of said filter to the edge of said filter.

22. The method of claim 20, wherein the spacing of the formed grating elements changes in stepped increments from the center of said filter to the edge of said filter.

23. The method of claim 19, wherein said formed filter is an infra-red block filter.

24. The method of claim 19, wherein said forming the filter step comprises forming said imaging device having an associated micro-lens array and said filter is formed over said micro-lens array.

25. A method of forming an imager, the method comprising the steps of:
forming an imaging device having a pixel array;
forming a lens over said imaging device; and
forming a single optical filter between said imaging device and said lens and over said entire pixel array, the optical filter having opaque and non-uniformly spaced grating elements spaced apart so that incident light can pass between them to reach the imaging device, wherein a first narrower spacing of grating elements occurs at a center of the filter and a second wider spacing of grating elements occurs at an edge of the filter.

26. The method of claim 25, wherein said forming the optical filter step further comprises forming at least a third spacing of grating elements in between said first spacing and said second wider spacing which is located between said center of said filter and said edge of said filter.

27. The method of claim 25, wherein said formed optical filter comprises silicon dioxide.

28. The method of claim 25, wherein said formed optical filter comprises a nitride.

29. An imager module comprising:
an imager having a pixel array formed over a substrate; and
a single optical filter formed over said entire pixel array, said optical filter having a plurality of light-blocking grating elements arranged so that incident light can pass through spaces between said grating elements, wherein spacing between grating elements increases progressively from a center of said optical filter to an edge of said optical filter.

30. The imager module of claim 29, wherein the spacing of said grating elements changes in stepped increments from the center of said optical filter to the edge of said optical filter.

31. The imager module of claim 29, wherein said optical filter is an infra-red block filter.

32. The imager module of claim 29, wherein the spacing between grating elements at the center of the optical filter corresponds to a desired wavelength of incident light to be passed through the optical filter.

33. The imager module of claim 32, wherein the spacing between grating elements at the edge of the optical filter compensates for angular shift in a direction of incident light to allow incident light of the desired wavelength to pass through to the imager.

* * * * *

UNITED STATES PATENT AND TRADEMARK OFFICE
CERTIFICATE OF CORRECTION

| | |
|---|---|
| PATENT NO. | : 7,965,444 B2 |
| APPLICATION NO. | : 11/513264 |
| DATED | : June 21, 2011 |
| INVENTOR(S) | : Ulrich C. Boettiger |

It is certified that error appears in the above-identified patent and that said Letters Patent is hereby corrected as shown below:

On the Title Page, in ("Primary Examiner"), line 1, delete "Leonaro" and insert -- Leonardo --, therefor.

Signed and Sealed this
Ninth Day of August, 2011

David J. Kappos
*Director of the United States Patent and Trademark Office*